United States Patent
Isa (10) Patent No.: US 6,175,527 B1
(45) Date of Patent: Jan. 16, 2001

(54) SEMICONDUCTOR MEMORY DEVICE HAVING REDUCED COMPONENT COUNT AND LOWER WIRING DENSITY

(75) Inventor: Satoshi Isa, Tokyo (JP)

(73) Assignee: NEC Corporation (JP)

(*) Notice: Under 35 U.S.C. 154(b), the term of this patent shall be extended for 0 days.

(21) Appl. No.: 09/268,617

(22) Filed: Mar. 15, 1999

(30) Foreign Application Priority Data

Mar. 25, 1998 (JP) .................................................. 10-077756

(51) Int. Cl.[7] .................................................. G11C 8/00
(52) U.S. Cl. ...................................... 365/200; 365/230.06
(58) Field of Search ............................... 365/200, 230.06

(56) References Cited

U.S. PATENT DOCUMENTS 5,798,973 * 8/1998 Isa ......................................... 365/200

FOREIGN PATENT DOCUMENTS

| 63206998 | 2/1987 | (EP) | .............................. | G11C/29/00 |
| 496282 | 1/1992 | (EP) | .............................. | G06F/11/20 |
| 9-320292 | 12/1997 | (JP) | .............................. | G11C/29/00 |

* cited by examiner

Primary Examiner—David Nelms
Assistant Examiner—M. Tran
(74) Attorney, Agent, or Firm—Hayes, Soloway, Hennessey Grossman & Hage, P.C.

(57) ABSTRACT

The present semiconductor memory device is provided with plurality of memory cell array blocks, a plurality of redundant memory cell lines, a replacement address program circuit outputting active level redundant selection signals on predetermined occasions, a replacement judging circuit outputting active level replacement judging signals on predetermined occasions, a redundancy selection signal encoder encoding redundancy selection signals inputted by the replacement address program and outputting them as redundancy selection encode signals, and a replacement control circuit decoding a plurality of redundancy selection encode signals inputted by the redundancy selection signal encoder when the replacement judging signals are at active level, selecting from among them redundancy memory cell lines corresponding to active level redundancy selection signals, and driving the selected redundancy memory cell lines by the redundancy line decoder. Further, in this device, the redundancy line decode circuit decoding redundancy selection encode signals is in common between the replacement control circuit 201 and the redundant line decoder.

19 Claims, 9 Drawing Sheets

SEMICONDUCTOR MEMORY DEVICE HAVING REDUCED COMPONENT COUNT AND LOWER WIRING DENSITY

BACKGROUND OF THE INVENTION

1. Field of the Invention

This invention relates to a semiconductor memory device, and more particularly to a semiconductor memory device provided with a redundant memory circuit having less number of devices configuring the whole device and lower wiring density in the memory region.

2. Description of the Prior Art

A semiconductor memory device is a highly integrated device provided with a great number of memory cell array blocks, that is difficult to function normally if there is even only one defective memory cell within memory cell array blocks. Therefore, in semiconductor memory devices, optional defective lines or defective rows within the memory cell array blocks are replaced with redundant lines or redundant rows to make it function normally.

Recently, semiconductor memory devices are proposed that are made to function normally by replacing optional defective lines or defective rows in many memory cell array blocks with redundant lines or redundant rows provided independently from the memory cell array blocks, with the objective to raise the production yield of semiconductor memory devices by increasing the flexibility of replacement and raising the relief efficiency for defective memory cells.

Figure 9:
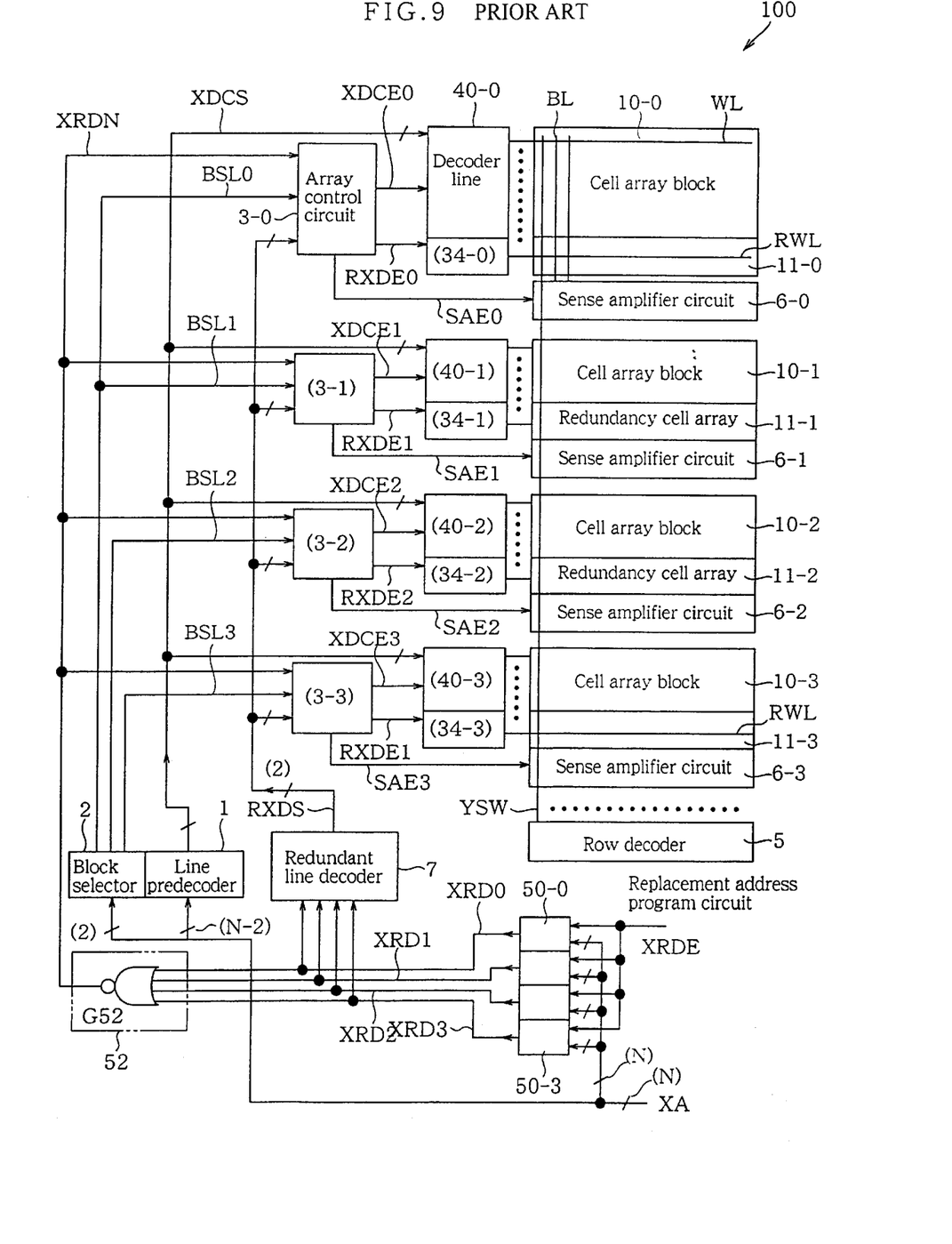
FIG. 9 is a total circuit diagram of a conventional semiconductor memory device.

A typical example of a conventional semiconductor memory device having redundant memory circuits for replacing by lines the memory cell lines of cell array blocks with is shown in FIG. 9. FIG. 9 is a block diagram of the circuit of a conventional semiconductor memory device.

As shown in FIG. 9, this semiconductor memory device 100 is provided with plurality (only four are shown in FIG. 9 for simplicity) of cell array blocks 10-0 to 10-3 in which memory cells are located as basic memory circuits in plurality of lines and plurality of rows, a block selector 2 with which to select one from the cell array blocks 10-0 to 10-3, a line predecoder 1 with which to designate a cell line to be selected from among the lines of the selected cell array blocks 10, and line decoders 40-0 to 40-3 with which to select and drive a cell line according to orders from the line predecoder 1.

The block selector 2 outputs block selection signals (BSL0 to BSL3) for selecting one of the cell array blocks 10-0 to 10-3 based on the two higher bits of the line address signal (XA) which is input to the semiconductor memory device 100.

The line predecoder 1 outputs predecoding signals (XDCS) for designating cell lines to be selected from the selected cell array blocks 10 by predecoding bit signals other than the higher two bits of the line address signals (XA).

Line decoders 40-0 to 40-3 are provided respectively corresponding to cell array blocks 10-0 to 10-3, and when the corresponding line decoder activation signals (XDCE0 to XDCE3) which are output from the array control circuit 3 described below are on the active level, select and drive cell lines designated by predecoding signals (XDCS) which are output from the line prdecoder 1 from the corresponding cell array block 10.

Also, as shown in FIG. 9, the semiconductor memory device 100, as a redundant memory circuit, is provided with plurality of redundant cell arrays 11-0 to 11-3 each comprised of one line amount of the redundant memory cell, plurality of replacement address program circuits 50-0 to 50-3 provided corresponding to the redundant cell arrays 11-0 to 11-3, a replacement judging circuit 52, a redundant line encoder 7, plurality of array control circuits 3-0 to 3-3 provided corresponding to the cell array blocks 10, and redundant line drivers 34-0 to 34-3.

When there are defective lines in the cell array blocks 10-0 to 10-3, the replacement address program circuits 50-0 to 50-3 will memorize line addresses corresponding to the defective lines, and output active level redundant line selection signals (XRD0 to XRD3) when the line address signal XA designates line addresses of the defective lines.

The replacement judging circuit 52 outputs active level replacement judging signal (XRDN) when there are active level signals in the redundant line selection signals (XRD0 to XRD3).

The redundant line encoder 7 is provided at a position close to the replacement address program circuits 50-0 to 50-3, and encodes redundant line selection signals XRD0 to XRD3 that are output from the replacement address program circuits 50-0 to 50-3 and outputs them as redundant line selection encode signals (RXDS)

The array control circuits 3-0 to 3-3 are provided respectively corresponding to line decoders 40-0 to 40-3 and redundant line decoders 34-0 to 34-3, and output active level line decoder activation signals (XDCE0 to XDCE3) and sense activation signals (SAE0 to SAE3) when the corresponding block selection signals (BSL0 to BSL3) are on the active level and the replacement judging signal (XRDN) is on the inactive level, namely when the situation is normal.

On the contrary when the replacement judging signal (XRDN) is on the active level, namely in redundancy, they switch the line decoder activation signals (XDCE0 to XDCE3) into inactive level as well as decode the redundant line selection encode signal RXDS, and then according to the results of decoding when the corresponding redundant line selection signals (XRD0 to XRD3) are on the active level, output active level redundant line selection signals (RXDE0 to RXDE3) and the sense activation signals (SAE0 to SAE3).

The redundant line drivers 34-0 to 34-3 are provided each corresponding to redundant cell arrays 11-0 to 11-3, and when the redundant line selection signals (RXDE0 to RXDE3) are on the active level, select and drive the corresponding redundant cell array 11.

Further, as shown in FIG. 9, the semiconductor memory device 100 has a row decoder 5 which selects one row of each of the cell array blocks 10-0 to 10-3 and the redundant cell arrays 11-0 to 11-3, as a common circuit of a basic memory circuit and a redundant memory circuit, and sense amplifier circuits 6-0 to 6-3 having a transfer gate.

The line decoder 5 selects one row of each of the cell array blocks 10-0 to 10-3 and the redundant cell arrays 11-0 to 11-3.

The sense amplifier circuits 6-0 to 6-3 having a transfer gate sense amplify the memory data of the memory cells where the selected lines and rows of corresponding cell array blocks 10-0 to 10-3 and redundant cell arrays 11-0 to 11-3 cross each other, and the memory data of redundant memory cells 11-0 to 11-3.

Figure 10:
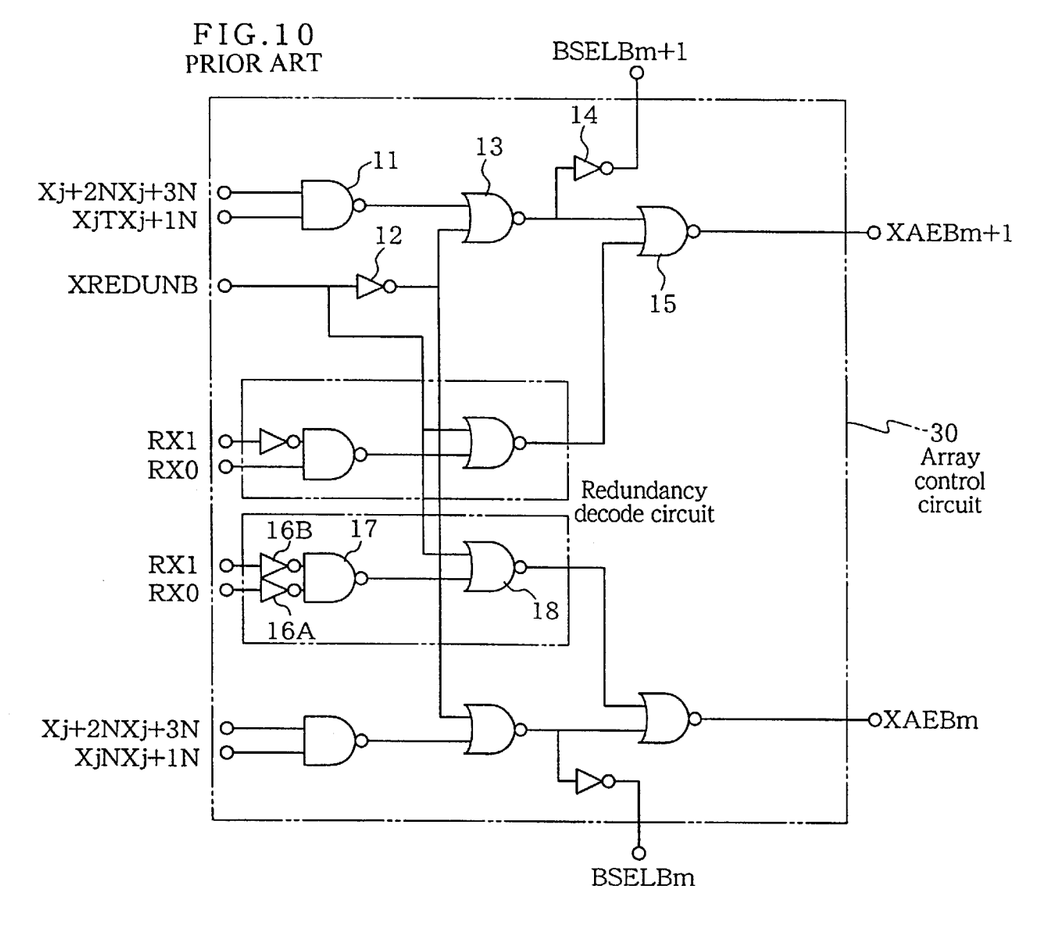
FIG. 10 is a circuit diagram of an array control circuit of the conventional semiconductor memory device.
Figure 11:
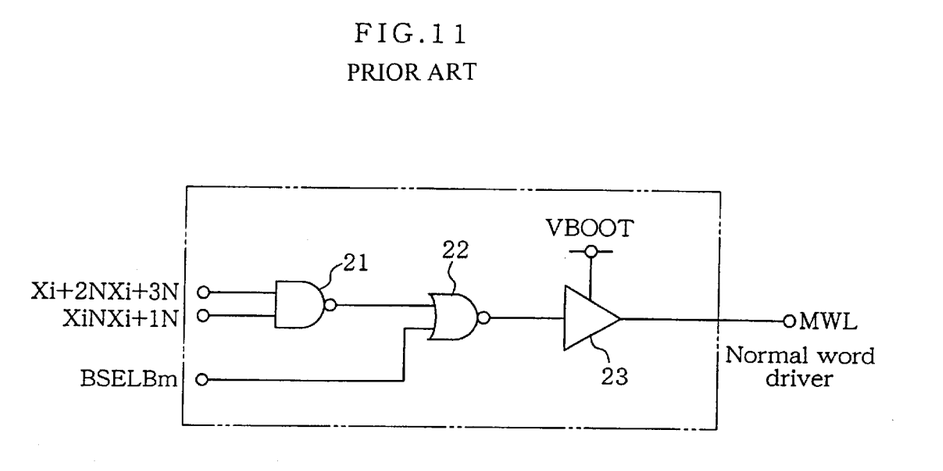
FIG. 11 is a circuit diagram of a normal word driver of the conventional semiconductor memory device.
Figure 12:
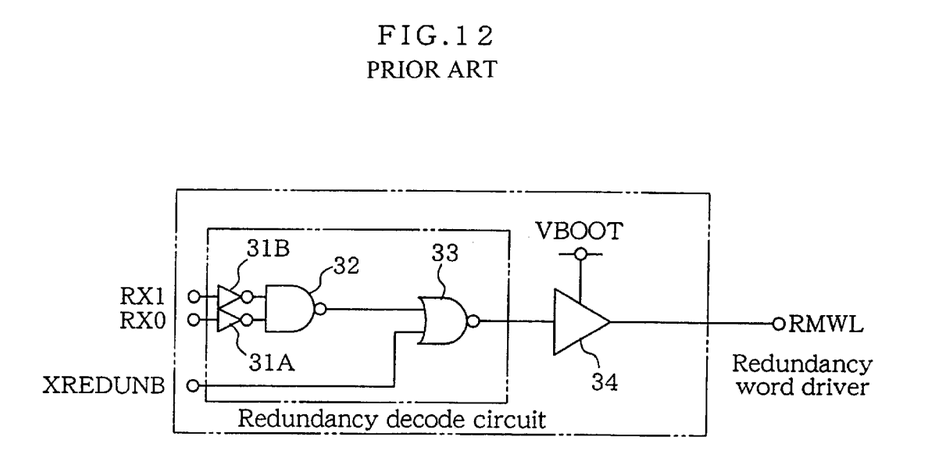
FIG. 12 is a circuit diagram of a redundancy word driver of the conventional semiconductor memory device.
Figure 13:
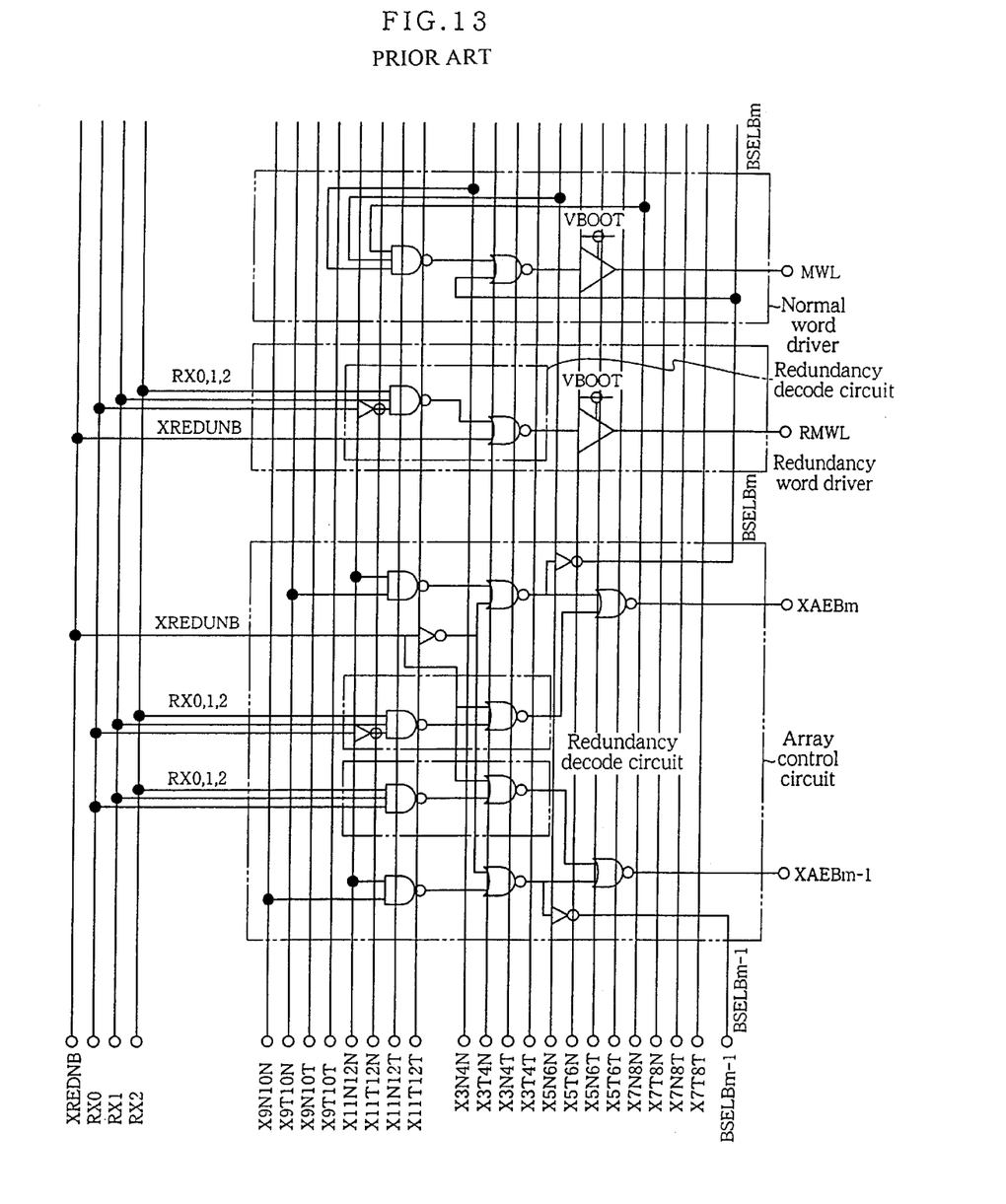
FIG. 13 is a wiring diagram of an array control circuit, a normal word driver, and a redundancy word driver in the conventional semiconductor memory device.

Particular examples of circuits of an array control circuit 3 for four cell array blocks 10-0 to 10-3, a line decoder 40, and a redundant line decoder 34 are shown in FIGS. 10, 11, and 12 respectively. FIG. 13 is a circuit diagram of a memory region, and the memory region shown in FIG. 13 is configured as having an array division number of 16 (selected by $X_9$ to $X_{12}$), 64 main word lines (MWL)/array (selected by $X_3$ to $X_8$), and 8 subword lines (SWL, redundant cell lines)/MWL (selected by $X_0$ to $X_2$).

The array control circuit 30 is configured with two array activation signal generating circuits each corresponding to two upper and lower cell array blocks 10, and two redundancy decode circuits.

As shown in FIG. 10, the array activation signal generation circuit is provided with a NAND gate (11) having input from two predecoding addresses for selecting main word lines ($X_{j+2N}X_{j+3N}$ and $X_{jT}X_{j+1N}$, shown in FIG. 13 as $X_{9N}X_{10N}$ and $X_{11T}X_{12N}$ respectively), and a NOR gate (13) which receives the output of the NAND gate (11) and the output of an inverter (12) receiving input of redundancy judgement signals (XREDUNB) which is outputted from a replacement judging circuit 52, and outputs through the inverter 14 the BSELBm which is outputted from the NOR gate (13).

It is further provided with a NOR gate (15) having input both from the output from the NOR gate (14) and the output from the redundancy decoder circuit, and outputs array activation signals (XAEBm).

On the other hand, the redundancy decoder circuit is provided with a NAND gate (17) having two encode addresses ($RX_0$, $RX_1$) for selecting redundancy word lines inputted through respective inverters (16A, B), and a NOR gate (18) receiving the output of the NAND gate (17) and the XREDUNB.

As shown in FIG. 11, the normal word driver is provided with a NAND gate (21) having two predecode addresses ($X_{j+2N}X_{j+3N}$ and $X_{iNxj}X_{j+1N}$, shown in FIG. 13 as $X_{3N4N}$ and $X_{5N6N}$ respectively) for selecting main word lines, a NOR gate (22) receiving the output from the NAND gate (21) and the BSELBm outputted from an array control circuit 30, and a buffer (23) comprised of a voltage converter using the output from the NOR gate (22) as its input, and drives the main word lines.

As shown in FIG. 12, the redundancy word driver is provided with a NAND gate (32) which inputs two encode addresses ($RX_0$ and $RX_1$) for selecting redundancy word lines through respective inverters (31A and B), an output of the NAND gate (32), a NOR gate (33) receiving the output from the NAND gate (32) and the XREDUNB outputted from a replacement judging circuit 52 as its input, and a voltage converter (34) receiving the output from the NOR gate (33) as its input, and selects and drives the redundancy word lines.

In FIGS. 10 to 13, $X_0$ to $X_2$: addresses for selecting subword lines $X_3$ to $X_8$: addresses for selecting main word lines $X_{j+2N}X_{j+3N}$: predecode addresses for selecting main word lines
(XDCS in FIG. 9)
($X_{3N4N}$ to $X_{7T8T}$ in FIG. 13)

$X_{jT}X_{j+1N}$: predecode addresses for selecting arrays
(BSLm in FIG. 9)
($X_{9N10N}$ to $X_{11T12T}$ in FIG. 13)

XREDUNB: redundancy judging signals
(replacement judging signals (XRDNm) in FIG. 9)
(Normal: high, redundancy: low)

BSELBm: normal word driver activation signals
(line decoder activation signals (XDCEm) in FIG. 9)
(enable: low, disable: high)

XAEBm: array activation signals
(SAEm in FIG. 9)
(enable: low, disable: high)

$RX_0$, $RX_1$, $RX_2$: encode addresses for selecting redundancy word lines (one from 8 is selected by 3 bits)
(RXDS from the redundancy line encoder in FIG. 9).

The array control circuit 3, the line decoder 40 and the redundant line decoder 34 shown in FIGS. 10 to 12 function as in the following manner in the normal (non-redundancy) and in the redundancy. Explanation of the following functions are based on FIG. 13.

In normal time (1) Line addresses are taken in through activation signals from the outside of the semiconductor memory devise 100 (not shown).

(2) Predecode addresses ($X_{3N4N}$, $X_{5N6N}$, $X_{7N8N}$, $X_{9N10N}$, and $X_{11N12N}$, (XDCS in FIG. 9) for selecting main word lines are generated by a line predecoder 1 shown in FIG. 9, based on internal line address signals (XA) of the semiconductor memory device 100. Here, if, for example, $X_3$ and $X_4$ are at "low" level, $X_{3N4N}$ will be at "high" level and $X_{3T4N}$, $X_{3N4T}$, and $X_{3T4T}$ are all at "low" level.

(3) As function is normal and the redundancy judging signals (XREDUNB) are at "high" level, one of the 16 arrays is selected by the predecode addresses ($X_{9N10N}$ to $X_{11T12T}$) for selecting arrays ($X_{9T10N}$ and $X_{11N12N}$ are selected in FIG. 13).

(4) The array activation signals (XAEBm) become "low" level and enable. Because of this, precharging of bit lines will finish, and preparation for sense-up activation will be established (not shown). As BSELBm is at "low" level, the normal word driver is in the enable state.

(5) One of the 64 normal word drivers is selected by the predecode addresses ($X_{3N4N}$ to $X_{7T8T}$) for selecting main word lines.

(6) Hereafter, although not shown in the figure, main word lines (MWL) are selected, sense-up is activated, and reading and writing of data and so on are conducted.

In redundancy time (1) and (2) proceed as in the normal time.

(3) As function is redundancy and the redundancy judging signals (XREDUNB) are at "low" level (not shown), one of the 16 redundant line arrays 11 is selected by the encode addresses ($RX_0$, $RX_1$, and $RX_2$) for selecting redundancy word lines which is outputted from the redundant line encoder. In FIG. 13 $RX_0$ is at "low" level, $RX_1$ is at "high" level, and $RX_2$ is at "high" level. Here redundancy arrays other than the selected redundancy array are in disable state because XREDUNB is at "low" level.

(4) The array activation signals (XAEBm) are at "low" level and enable. Because of this, precharging of bit lines will finish, and preparation for sense-up activation will be established (not shown). And, as BSELBm is at "high" level, the normal word driver is in the disable state.

(5) One of the 8 redundancy word drivers is selected by the encode addresses ($RX_0$, $RX_1$, and $RX_2$) for selecting redundancy word lines.

(6) Hereafter, although not shown in the figure, subword lines (RWL) are selected, sense-up is activated, and reading and writing of data and so on are conducted.

BRIEF SUMMARY OF THE INVENTION

Object of the Invention

However, the conventional semiconductor memory devices with the redundant circuits described above have following problems, thereby making it difficult to achieve miniaturization and high integration of the semiconductor memory devices.

First, the number of circuit devices constructing redundancy word driver (redundant line driver) is greater than that constructing normal word driver. This not only raises costs, but also makes the layout size of the redundancy word driver larger than the layout size of the normal word driver, making it necessary to secure extra space.

Second, there are so many signal wires leading into the redundancy word driver that wider wiring space is required and wiring density becomes higher, lowering efficiency of the wiring forming process.

Therefore, the object of the present invention is to provide semiconductor memory devices with reduced number of elements configuring memory circuits and lower wiring density in the memory region.

Summary of the Invention

The inventors of the present invention paid attention to the fact that the configuration of the redundancy decode circuit provided in the array control circuit was the same as the configuration of the redundancy decode circuit of the redundancy word driver, reached to an idea of using the decode circuit of redundancy word driver selected by encode signals for selecting redundancy lines in common with as redundancy decode circuit of the array control circuit, to complete the present invention.

In order to achieve the above object, a semiconductor memory device of this invention is provided with plurality of memory cell array blocks each having plurality of memory cell lines, plurality of redundant memory cell lines driven by the redundant line decoder, a replacing address program circuit that outputs signals for selecting active level redundant lines in predetermined occasions, a replacement judging circuit that outputs signals for judging active level replacement in predetermined occasions, a redundant line selection signal encoder that encodes redundant line selection signals input by the replacing address program circuit, and output them as encode signals for selecting redundant lines, a replacement control circuit that decodes plurality of redundant line selecting encode signals input by the redundant line selection signal encoder when the replacement judging signal is at active level and selects the memory cell line corresponding to the active level redundant line selection signal and drives the selected the redundant memory cell line by the redundant line decoder, the semiconductor memory device of the present invention is characterized by the redundant line decode circuit for decoding redundant line selection encode signals that is used in common both by the redundant line decoder and by the replacement control circuit.

In the present invention, the predetermined occasion in which the replacement address program circuit outputs active level redundant line selection signals is when defective lines exist in the cell array block, and when the replacement address program circuit memorizes the line addresses corresponding to the defective lines and the line address signal designates the line addresses of the defective lines. At this time the replacement address program circuit outputs active level redundant line selection signals.

The predetermined occasion in which the replacement judging circuit outputs active level replacement judging signals is when there are active level signals in the redundant line selection signals output from the replacement address program circuit. At this time the replacement judging circuit outputs active level replacement judging signals.

The redundant line decode circuit may be provided in the replacement control circuit. In this case the number of redundant line decoders that have the redundant line decode circuit in common with a replacement control circuit is not limited. For example, a redundant line decoder of two adjacent redundant memory cell lines may have a redundant line decode circuit in common with a replacement control circuit, and even a redundant line decoder of four adjacent redundant memory cell lines may have a redundant line decode circuit in common with a replacement control circuit.

Further, the redundant line decode circuit may be provided in the redundant line decoder.

Although there is no limitation in the configuration of the redundant line decode circuit, the common redundant line decode circuit, for example, is provided with a NAND gate with which to input redundant line selection encode signals, that is output from redundant line selection signal encoder, through respective inverters, and a NOR gate to which the output of the NAND gate and the replacement judging signal output from the replacement judging circuit are input.

In the semiconductor memory device of the present invention, the total number of elements of a circuit configuring replacement control circuit and redundant line decoder can be greatly reduced by providing a redundant line decode circuit having the replacement control circuit and the redundant line decoder in common, and thus the wiring density across the memory region can be lowered.

DETAILED DESCRIPTION OF THE PREFERRED EMBODIMENTS

The embodiment of the present invention will be particularly and precisely described below with examples and with reference to appended drawings.

EXAMPLE 1

Figure 1:
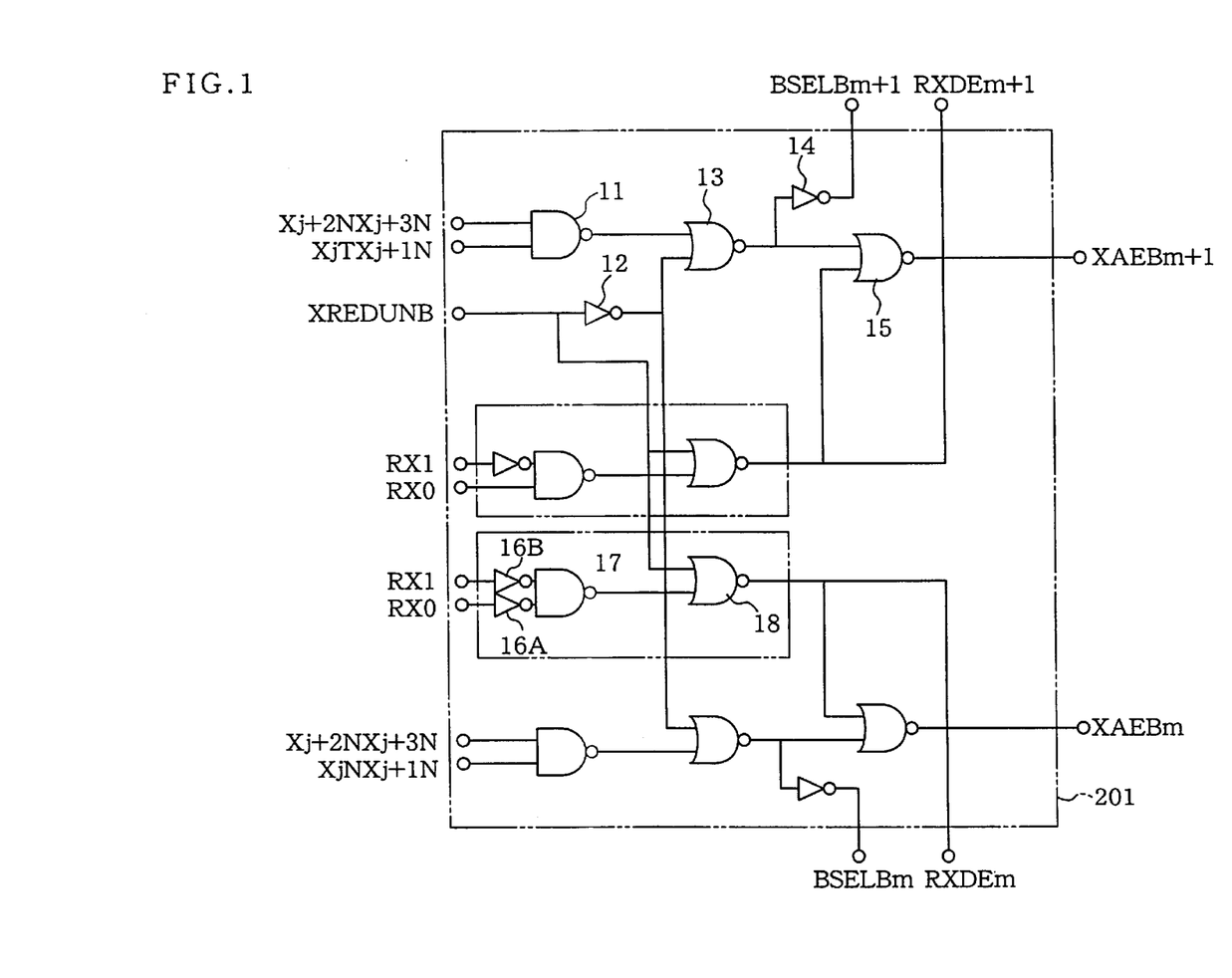
FIG. 1 is a circuit diagram of an array control circuit of the semiconductor memory device of an Example 1.
Figure 2:
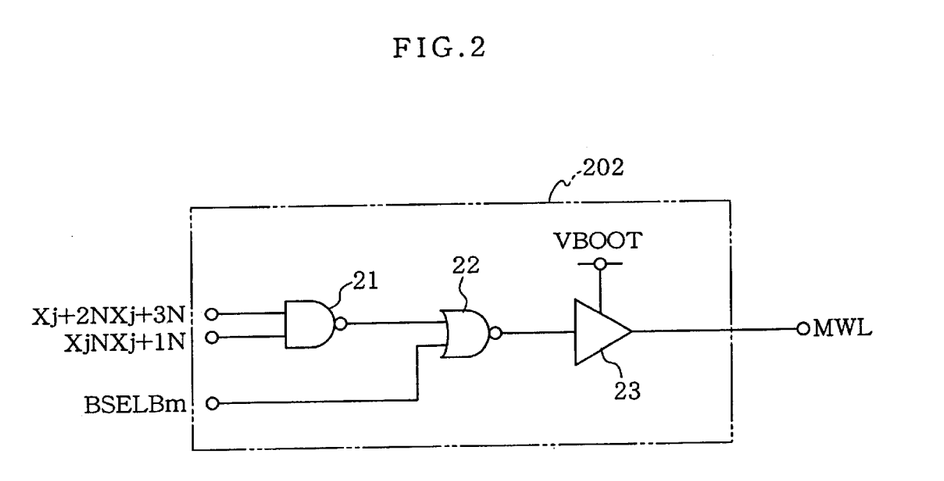
FIG. 2 is a circuit diagram of a normal word driver of the semiconductor memory device of the Example 1.
Figure 3:
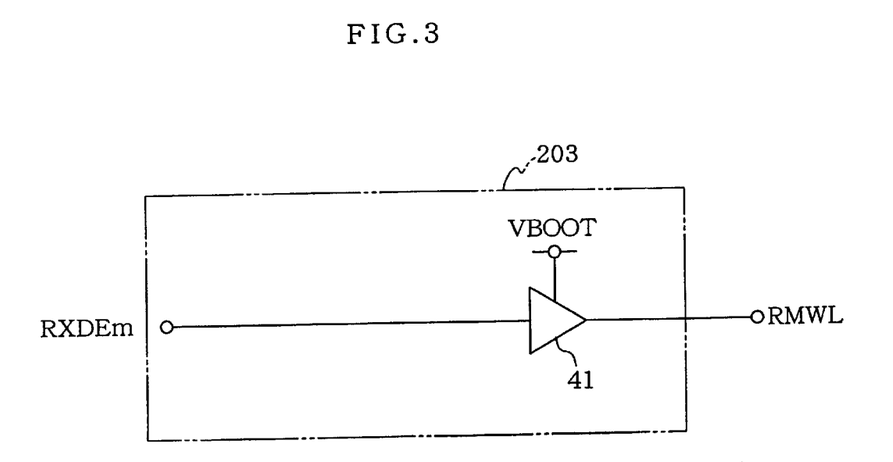
FIG. 3 is a circuit diagram of a redundancy word driver of the semiconductor memory device of the Example 1.

This example is an example of an embodiment of a semiconductor memory device relating to the present invention, and FIGS. 1,2, and 3 are circuit diagrams of essential elements of the semiconductor memory device of this example, namely an array control circuit, a normal word driver, and a redundancy word driver, respectively.

The semiconductor memory device of this example has the same configuration as the conventional semiconductor memory device 100 shown in FIG. 9, except for the circuit configuration of an array control circuit 201 and a redundancy word driver 203.

As shown in FIG. 1, in addition to the configuration of the array control circuit 30 of the conventional configuration shown in FIG. 10, the array control circuit 201 of this semiconductor memory device is provided with a circuit for inputting NOR gate (18) output to upper and lower redundancy word driver 203 as redundancy word line selection signals (RXDEm).

As shown in FIG. 2, a normal word driver 202 is provided with the same circuit configuration as that of the conventional normal word driver shown in FIG. 11.

As shown in FIG. 3, the redundancy word driver 203 is provided with only a buffer (41) comprised of a voltage converter, and voltage-converts and outputs redundancy word line selection signals (RXDEm) which is inputted from the array control circuit 201, and drive the redundancy word line RMWL.

In the semiconductor memory device of this example, the array control circuit 201, the normal word driver 202, and the redundancy word driver 203 of the configuration described above function basically same as in the conventional semiconductor memory device 100, and in the normal time, the semiconductor memory device will function exactly the same as the conventional semiconductor memory device described above.

Also in the redundancy time, it functions in the same manner as the conventional semiconductor memory device 100 described above, except that input is made from the array control circuit 201 to the redundancy word driver 203 and the redundancy word driver 203 is selected by redundancy word line selection signals (RXDEm).

Figure 4:
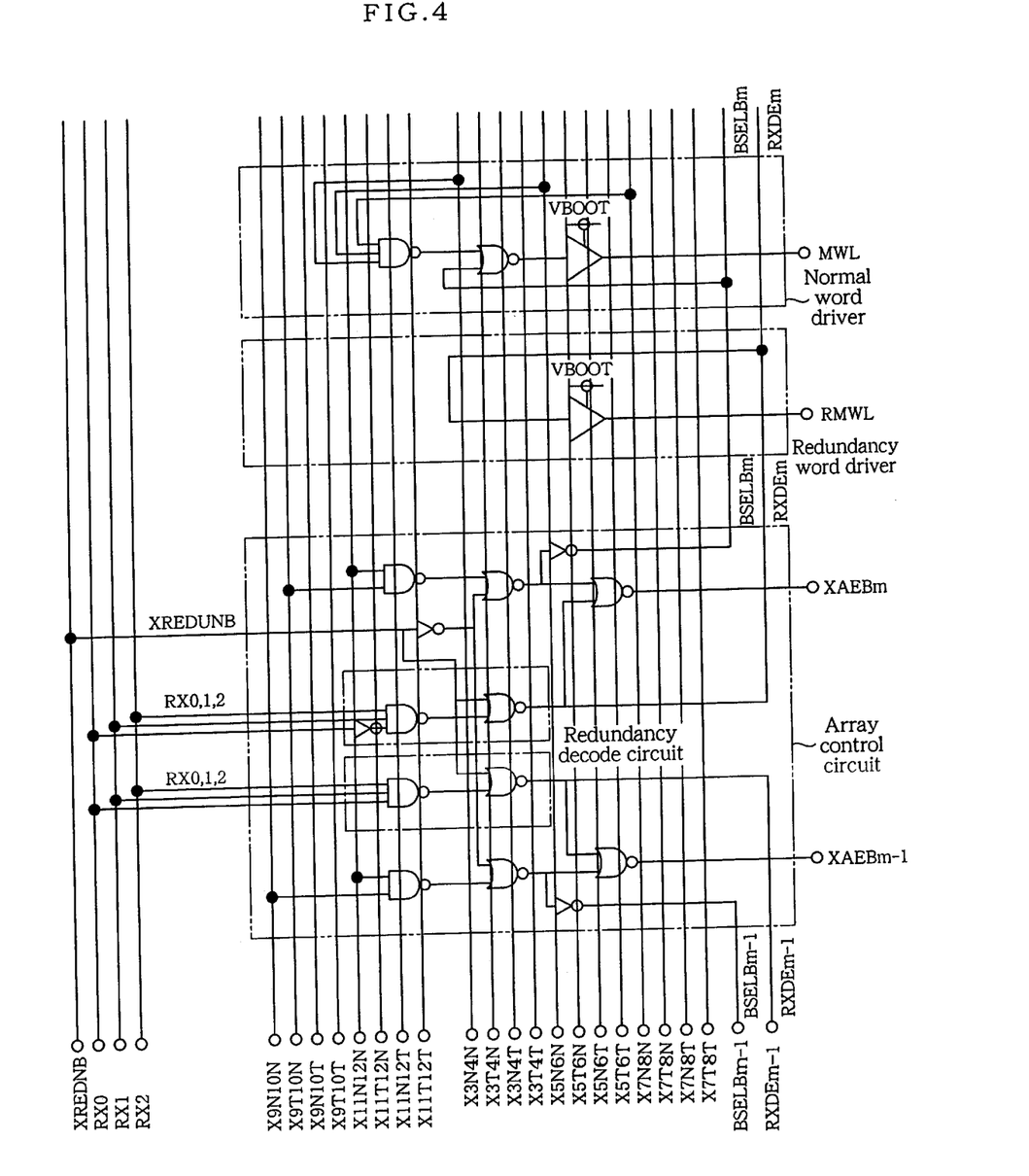
FIG. 4 is a wiring diagram of an array control circuit, a normal word driver, and a redundancy word driver for the semiconductor memory device of the Example 1.

As only one element, a voltage converter, comprises the circuit of the normal word driver 203 in the semiconductor memory device of this example, there is no need to provide wiring, as shown in FIG. 4, from the address signal wiring, across the highly integrated memory region, to the normal word driver 203. Therefore, wiring density of the memory region can be reduced so much. Now, FIG. 4 shows a memory region whose configuration is the same as that shown in FIG. 13, configured with 16 array divisions (selected by $X_9$ to $X_{12}$), 64 main word lines (MWL)/array (selected by $X_3$ to $X_8$), and 8 subword lines (SWL, redundant cell lines) /MWL (selected by $X_0$ to $X_2$).

Though wiring formation process of the region is essentially difficult, as wiring density of the memory region is very high, tending to reduce product yield, efficiency and product yield is improved in this example, since wiring density is reduced.

EXAMPLE 2

This example is another example of the embodiment of the semiconductor memory device related to the present invention, and FIGS. 5 to 8 are circuit diagrams of the essential elements of the semiconductor memory device of this example, namely array control circuit, normal word driver, and redundancy word driver respectively.

Figure 5:
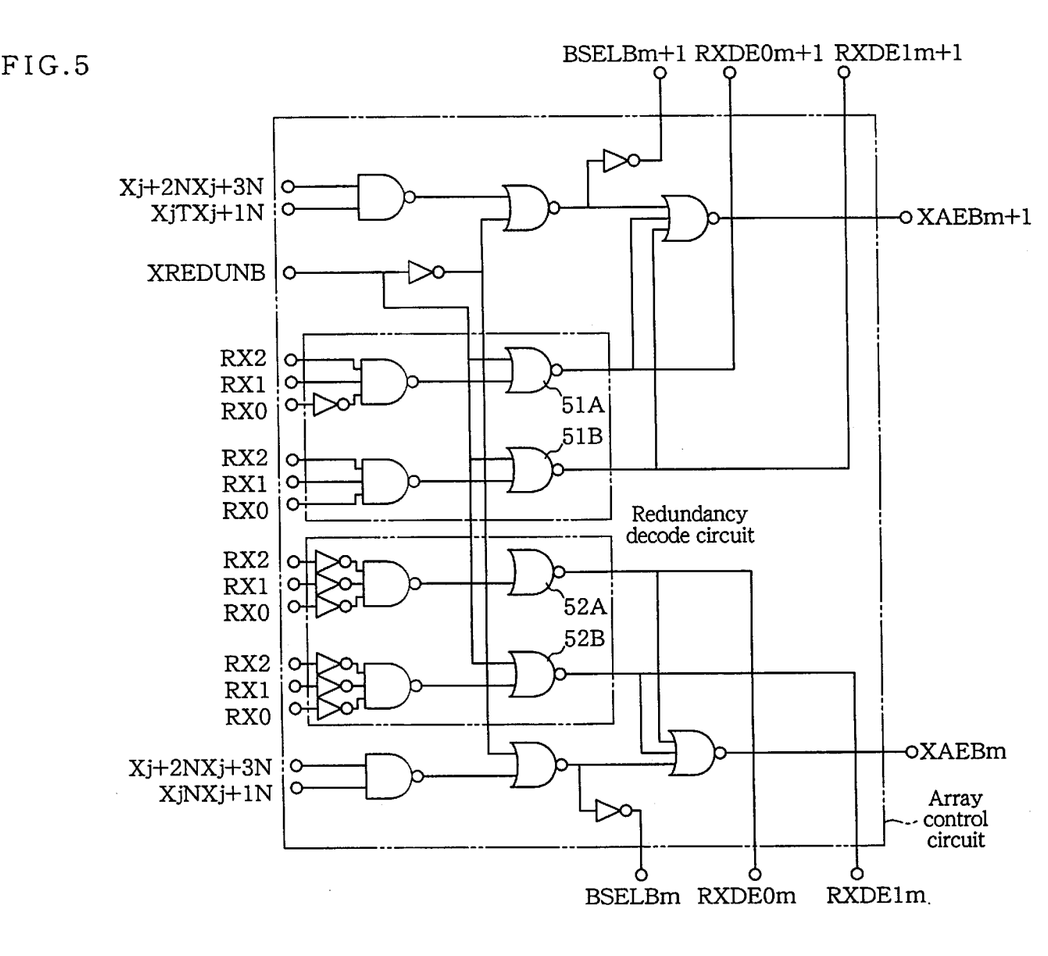
FIG. 5 is a circuit diagram of an array control circuit of the semiconductor memory device of an Example 2.

The array control circuit 301 of the semiconductor memory device of this example has two upper and lower redundancy word driver 303A, B and a redundancy decode circuit in common. Besides array control circuit 30 of the conventional configuration shown in FIG. 10, the array control circuit 301 is further provided with a redundancy decode circuit of the same configuration as the redundancy decode circuit of the array control circuit 30, and provided with a circuit for inputting the output of the NOR gate (51A, B, 52A, B) to the redundancy word driver 303A, B, as redundancy word line selection signals (RXDEm), as shown in FIG. 5.

Figure 6:
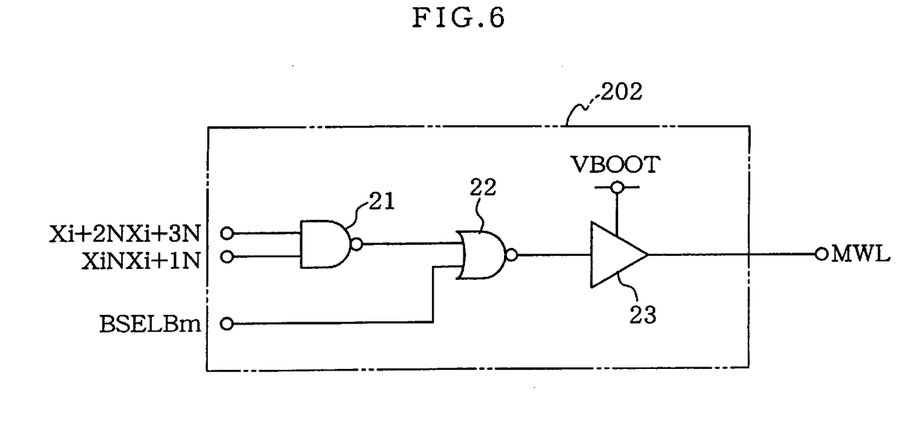
FIG. 6 is a circuit diagram of a normal word driver of the semiconductor memory device of the Example 2.

As shown in FIG. 6, the normal word driver 302 is provided with the same circuit configuration as the conventional normal word driver shown in FIG. 11.

Figure 7:
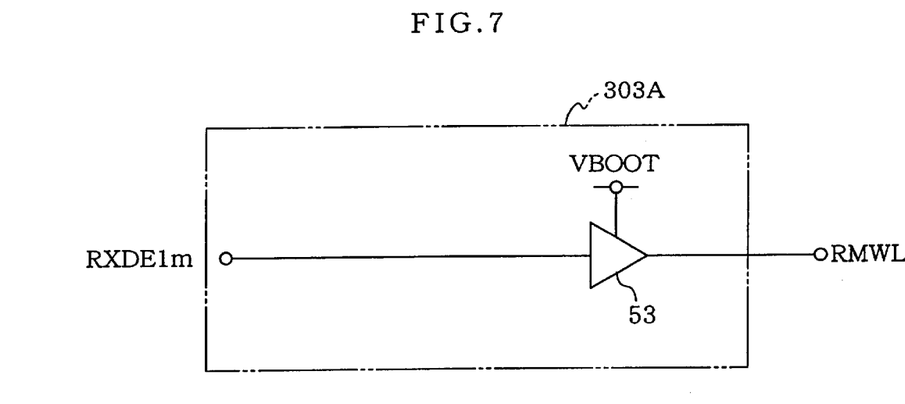
FIG. 7 is a circuit diagram of a redundancy word driver the semiconductor memory device of the Example 2.
Figure 8:
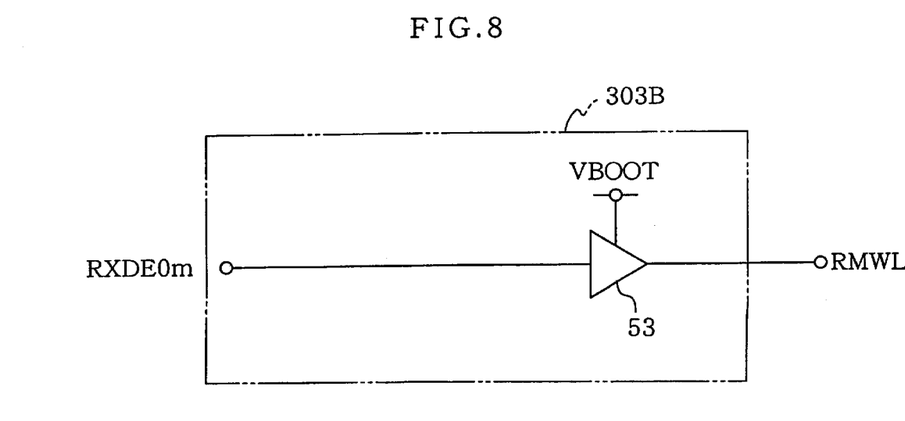
FIG. 8 is a circuit diagram of another redundancy word driver of the semiconductor memory device of the Example 2.

As shown in FIGS. 7 and 8 respectively, the redundancy word drivers 303A and 303B are provided with only a voltage converter (53), voltage-convert and output redundancy word line selection signals (RXDEm) input from the array control circuit 301, and drive the redundancy word lines.

In this example, since the total number of elements of the normal word driver is further reduced as compared with Example 1, wiring density is further lowered.

According to the present invention, by configuring a semiconductor memory device provided with a redundant line decode circuit having a replacement control circuit and a redundant line decoder in common, the total number of elements of a replacement control circuit and a redundant line decoder can be substantially reduced, and thus the wiring density across the memory region can be substantially lowered.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-077756 (Filed on Mar. 25$^{th}$, 1998) including specification, claims, drawings and summary are incorporated herein by reference in its entirety.

What is claimed is:

1. A semiconductor memory device, characterized by that a redundancy decode circuit which decodes redundancy selection encode signals is in common between a replacement control circuit and a redundant line decoder, comprising:

plurality of memory cell array blocks each having plurality of memory cell lines;

plurality of redundant memory cell lines driven by the redundant line decoder;

a replacement address program circuit outputting active level redundant line selection signals on predetermined occasions, a replacement judging circuit outputting active level replacement judging signals on predetermined occasions, a redundancy line selection signal encoder encoding redundancy line selection signals inputted by a replacement address program circuit and outputting the redundancy line selection signals as redundancy line selection encode signals, and a replacement control circuit comprising a common redundant line decode circuit for decoding a plurality of redundancy line selection encode signals input by the redundancy selection signal encoder when the replacement judging signals are at active level, selecting from among them redundancy memory cell lines corresponding to active level redundancy line selection signals, and driving the selected redundancy memory cell lines by the redundancy line decoder.

2. The semiconductor memory device of claim 1, characterized in that a redundant line decoder of two adjacent redundancy memory cell lines has a redundant line decode circuit in common with a replacement control.

3. The semiconductor memory device of claim 1, characterized in that a redundant line decoder of four adjacent redundancy memory cell lines has a redundant line decode circuit in common with a replacement control.

4. The semiconductor memory device of claim 1, characterized in that a common redundant line decode circuit is provided in the redundant line decoder.

5. The semiconductor memory device of claim 1, characterized in that the common redundant line decode circuit is provided with a NAND gate that inputs the redundancy line selection encode signals, output from the redundancy line selection signal encoder, through the inverter respectively, and a NOR gate that receives as the input the output of the NAND gate and the replacement judging signals output from the replacement judging circuit.

6. The semiconductor memory device of claim 1, characterized in that a redundant line decoder of two adjacent redundancy memory cell lines has a redundant line decode circuit in common with a replacement control.

7. The semiconductor memory device of claim 1, characterized in that a redundant line decoder of four adjacent redundancy memory cell lines has a redundant line decode circuit in common with a replacement control.

8. The semiconductor memory device of claim 1, characterized in that the common redundant line decode circuit is provided with a NAND gate that inputs the redundancy line selection encode signals, output from the redundancy line selection signal encoder, through the inverter respectively, and a NOR gate that receives as the input the output of the NAND gate and the replacement judging signals output from the replacement judging circuit.

9. The semiconductor memory device of claim 4, characterized in that the common redundant line decode circuit is provided with a NAND gate that inputs the redundancy line selection encode signals, output from the redundancy line selection signal encoder, through the inverter respectively, and a NOR gate that receives as the input the output of the NAND gate and the replacement judging signals output from the replacement judging circuit.

10. A semiconductor memory device, comprising:

a redundancy decode circuit which decodes redundancy selection encode signals is in common between a replacement control portion and a redundant line decoder;

plurality of memory cell array blocks each having plurality of memory cell lines;

plurality of redundant memory cell lines driven by the redundant line decoder;

a replacement address program circuit outputting active level redundant line selection signals on predetermined occasions, replacement judging circuit outputting active level replacement judging signals on predetermined occasions, a redundancy line selection signal encoder encoding redundancy line selection signals inputted by a replacement address program circuit and outputting the redundancy line selection signals as redundancy line selection encode signals, and a replacement control portion decoding a plurality of redundancy line selection encode signals input by the redundancy selection signal encoder when the replacement judging signals are at active level, selecting from among them redundancy memory cell lines corresponding to active level redundancy line selection signals, and driving the selected redundancy memory cell lines by the redundancy line decoder.

11. The semiconductor memory device of claim 10, wherein said replacement control portion includes a common redundancy line decode circuit.

12. The semiconductor memory device of claim 10, wherein a redundant line decoder of two adjacent redundant memory cell lines has a redundancy line decode circuit in common with a replacement control.

13. The semiconductor memory device of claim 10, wherein a redundant line decoder of four adjacent redundant memory cell lines has a redundancy line decode circuit in common with a replacement control.

14. The semiconductor memory device of claim 10, wherein a common redundancy line decode circuit is provided in the redundant line decoder.

15. The semiconductor memory device of claim 10, wherein the common redundancy line decode circuit is provided with a NAND gate that inputs the redundancy line selection encode signals, output from the redundancy line selection signal encoder, through an inverter respectively, and a NOR gate that receives as the input the output of the NAND gate and the replacement judging signals output from a replacement judging circuit.

16. The semiconductor memory device of claim 11, wherein a redundant line decoder of two adjacent redundant memory cell lines has a redundancy line decode circuit in common with a replacement control.

17. The semiconductor memory device of claim 11, wherein a redundant line decoder of four adjacent redundant memory cell lines has a redundancy line decode circuit in common with a replacement control.

18. The semiconductor memory device of claim 11, wherein the common redundancy line decode circuit is provided with a NAND gate that inputs the redundancy line selection encode signals, output from the redundancy line selection signal encoder, through an inverter respectively, and a NOR gate that receives as the input the output of the NAND gate and the replacement judging signals output from a replacement judging circuit.

19. The semiconductor memory device of claim 15, wherein the common redundancy line decode circuit is provided with a NAND gate that inputs the redundancy line selection encode signals, output from the redundancy line selection signal encoder, through an inverter respectively, and a NOR gate that receives as the input the output of the NAND gate and the replacement judging signals output from a replacement judging circuit.

* * * * *